United States Patent
Sanvito et al.

(10) Patent No.: US 10,813,241 B2
(45) Date of Patent: Oct. 20, 2020

(54) ASSEMBLY FORMING A CASING FOR ELECTRICAL EQUIPMENT

(71) Applicant: VALEO SIEMENS EAUTOMOTIVE FRANCE SAS, Cergy (FR)

(72) Inventors: Guillaume Sanvito, Elancourt (FR); Pierre Smal, Satrouville (FR)

(*) Notice: Subject to any disclaimer, the term of this patent is extended or adjusted under 35 U.S.C. 154(b) by 0 days.

(21) Appl. No.: 15/776,044

(22) PCT Filed: Nov. 11, 2016

(86) PCT No.: PCT/EP2016/077419
§ 371 (c)(1),
(2) Date: May 14, 2018

(87) PCT Pub. No.: WO2017/081243
PCT Pub. Date: May 18, 2017

(65) Prior Publication Data
US 2018/0332728 A1 Nov. 15, 2018

(30) Foreign Application Priority Data
Nov. 13, 2015 (FR) ...................................... 15 60864

(51) Int. Cl.
*H05K 5/00* (2006.01)
*H02M 7/00* (2006.01)
(Continued)

(52) U.S. Cl.
CPC .......... *H05K 7/1432* (2013.01); *H02M 7/003* (2013.01); *H05K 5/0021* (2013.01);
(Continued)

(58) Field of Classification Search
CPC .... H05K 5/0021; H05K 5/0026; H05K 5/003; H05K 5/0034; H05K 5/0004;
(Continued)

(56) References Cited

U.S. PATENT DOCUMENTS 5,156,556 A 10/1992 Ma
9,066,453 B2* 6/2015 Wagner ................ H05K 1/0203
(Continued)

FOREIGN PATENT DOCUMENTS

EP 2876988 A1 5/2015
KR 20110139038 A 12/2011

OTHER PUBLICATIONS

International Search Report and Written Opinion of the Search Authority for PCT/EP2016/077419.
French Office Preliminary Search Report.

*Primary Examiner* — Adrian S Wilson

(57) ABSTRACT

The invention relates to an assembly forming a casing for electrical equipment, said assembly comprising: a first casing for receiving at least a first electronic component of the electrical equipment; a second casing for receiving at least a second electronic component of the electrical equipment; a first wall of the first casing, known as the first interface wall, and a second wall of the second casing, known as the second interface wall, said walls being arranged to press against one another in order to form the assembly. According to the invention, the first and second casings each comprise at least one side wall, known as the first and second sidewalls respectively, said side walls extending from the first and second interface walls respectively in the opposite direction relative to the other casing; and the second side wall comprises an opening, known as the connection opening, for receiving an electrical connector, and a portion around the opening, known as the connection portion, for receiving a sealing part of the electrical connector, said first and second side walls being arranged such that the connection portion extends towards the first casing so as to face one surface of the first side wall.

10 Claims, 12 Drawing Sheets

(51) Int. Cl.
  *H05K 7/14* (2006.01)
  *H05K 7/20* (2006.01)
(52) U.S. Cl.
  CPC ......... *H05K 5/0052* (2013.01); *H05K 5/0056* (2013.01); *H05K 7/20927* (2013.01)
(58) Field of Classification Search
  CPC .. H05K 5/0047; H05K 5/0052; H05K 5/0056; H05K 5/0069
  See application file for complete search history.

(56) References Cited

U.S. PATENT DOCUMENTS

| | | | |
|---|---|---|---|
| 9,398,726 B2* | 7/2016 | You | H05K 7/20254 |
| 9,414,480 B2* | 8/2016 | Lu | H05K 7/1432 |
| 9,468,120 B2* | 10/2016 | Lu | H05K 7/1432 |
| 9,661,786 B2* | 5/2017 | Lu | H05K 7/1432 |
| 2012/0069532 A1* | 3/2012 | Azumi | H05K 5/0052 |
| | | | 361/752 |
| 2012/0325447 A1* | 12/2012 | You | F28F 3/048 |
| | | | 165/170 |
| 2012/0326663 A1* | 12/2012 | You | B60L 11/1812 |
| | | | 320/109 |
| 2013/0223011 A1* | 8/2013 | You | H05K 7/20927 |
| | | | 361/702 |
| 2013/0250521 A1* | 9/2013 | Kawai | H05K 7/20854 |
| | | | 361/714 |
| 2015/0146377 A1* | 5/2015 | You | H05K 7/1432 |
| | | | 361/707 |
| 2018/0334116 A1* | 11/2018 | Sanvito | H05K 7/1432 |

* cited by examiner

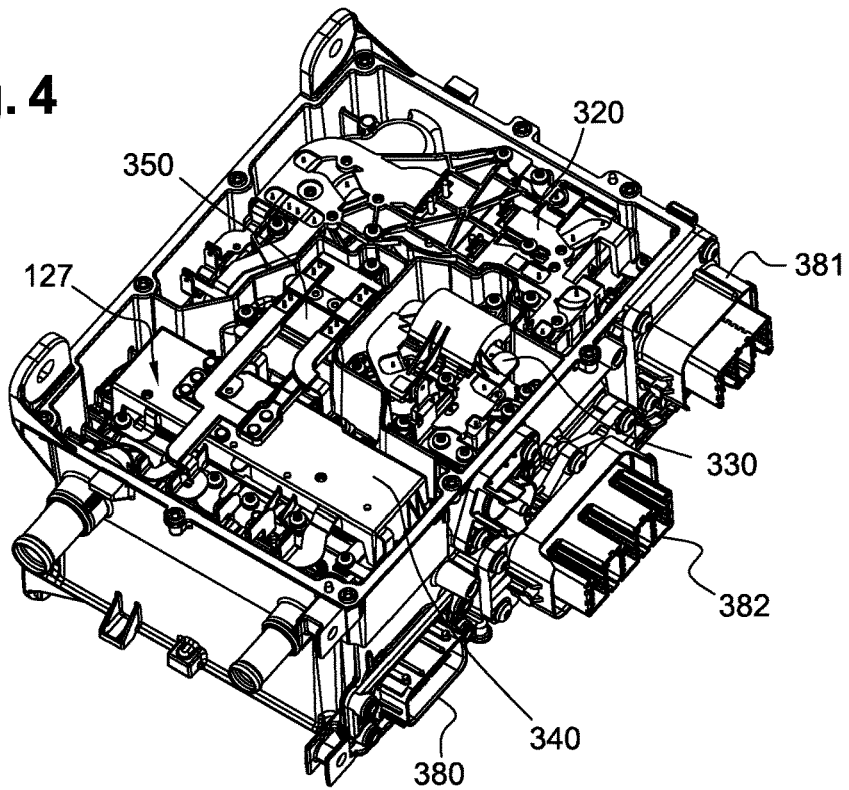
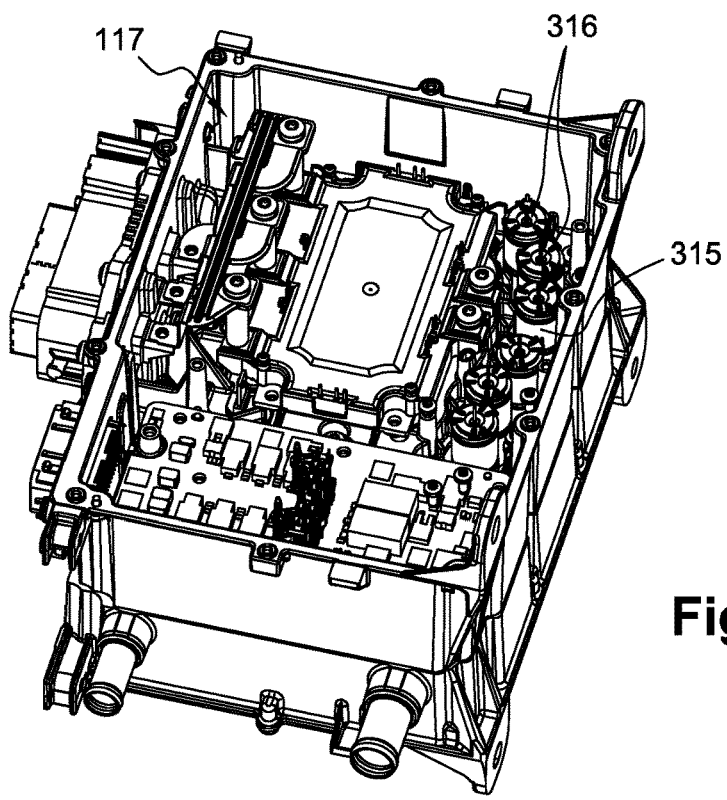

ASSEMBLY FORMING A CASING FOR ELECTRICAL EQUIPMENT

The invention relates to an assembly forming a casing for electrical equipment and an electrical equipment comprising an assembly based on the invention, particularly for applications in the automotive industry.

We all know an inverter that controls an on-board electrical machine in a motor vehicle. The on-board machine in the vehicle may be used to drive the vehicle's wheels. Such an inverter may be equipped with a power electronic unit comprising components that carry the power to supply the electrical machine, as well as an electronic control unit comprising components to control the components of the power electronic unit.

We equally know DC/DC voltage converters embedded in vehicles to convert the voltage between a first power circuit and a second power circuit in the vehicle. Generally, the first power circuit is a low voltage circuit delivering a voltage below 60V, i.e. roughly 18V or 12V, while the second power circuit is a high voltage circuit delivering a voltage above 60V, i.e. above 100V, 200V or even 400V. In order to optimise integration density in the vehicle, the inverter and the DC/DC converter may be built into a single piece of electrical equipment inside the vehicle.

The inverter and DC/DC converter are exposed to heating not only from their environment, but also due to the high power ratings that flow through them when the machine is running at high voltage or when the DC/DC converter performs a high-low voltage conversion.

To cool down the inverter and DC/DC converter effectively, a two-compartment electrical equipment casing is generally provided, in which the inverter components and the DC/DC converter components are fitted into each compartment, with a cooling system mounted in between the two compartments of the casing. For instance, the publication on patent application KR20110139038 A describes an electrical equipment casing in which a first casing carries the inverter components, while the second casing contains the DC/DC converter components. One of the walls of the first casing presses against a wall of the second casing to form flow channels for a coolant.

However, the construction of the two-compartment casing is complex and raises issues of sealing (tightness) of the cooling system or integration of the components into the two-compartment casing.

The invention seeks to at least partly address issues already encountered in the trade by proposing an assembly forming a casing for electrical equipment, the said assembly comprising:

a first casing for receiving at least a first electronic component of the electrical equipment;

a second casing for receiving at least a second electronic component of the electrical equipment;

a first wall of the first casing, known as the first interface wall, and a second wall of the second casing, known as the second interface wall, the said walls arranged to press against one another to form the assembly;

wherein:

the first and second casings each comprise at least one side wall, known as the first and second side walls respectively, the said side walls extending from the first and second interface walls respectively in the opposite direction relative to the other casing; and the second side wall comprising an opening, known as the connection opening, for receiving an electrical connector, and a portion around the opening, known as the connection portion, for receiving a sealing part of the electrical connector, the said first and second side walls arranged such that the connection portion extends towards the first casing so as to face one surface of the first side wall.

By allowing the connection portion to overlap on the first casing, the height of the second side wall is lower relative to the second interface wall, thereby reducing the overall dimensions of the assembly forming a casing for electrical equipment, particularly at the level of its second casing.

According to an implementation of the invention, the said first and second side walls each form an outer wall for their respective casing, the said connection opening having been arranged to receive an electrical connector from outside the assembly forming a casing.

According to an implementation of the invention, at least part of the connection portion of the second side wall is fitted with a corresponding projection located on the surface of the first side wall.

According to an implementation of the invention, the said part of the connection portion has a thickness designed to match with the depth of the projection and has a hole for receiving a device to fasten the sealing part of said electrical connector to the connection portion.

According to an implementation of the invention:

the second interface wall comprises a protrusion, the said protrusion engaging with an edge of the connection opening to create a passage for an electrical connection between the electrical connector and a component of the electrical equipment;

the first interface wall comprises a projection designed to receive the protrusion from the second interface wall.

The invention also relates to an electrical equipment comprising:

an assembly designed according to the invention;

at least a first electrical component housed in the first casing;

at least a second electrical component housed in the second casing;

a first electrical connector running through the connection opening and electrically connected to an electrical component of the electrical equipment, with a sealing part of the first electrical connector fastened to the said connection portion.

According to an implementation of the invention, the electrical equipment comprises:

switches of an inverter and/or switches of a DC/DC voltage converter housed in the first casing; and filtering and rectification components housed in the second casing.

According to an implementation of the invention, the function of the first electrical connector is to exchange power between components of the electrical equipment and a component outside the electrical equipment.

According to an implementation of the invention, the first and second walls both have at least a through-hole with edges that link up to create a passage for an electrical connection between the first and the second electrical components.

According to an implementation of the invention, the electrical connection between the first and the second components is provided by a second electrical connector comprising:

a rigid conductive part coated with electrically-insulating material;

a first end connected to one of the electrical terminals of the first component; and a second end connected to one of the electrical terminals of the second component.

Details of the invention will be provided in the following description using the drawings appended hereto. It should be noted that the drawings are solely aimed at illustrating the contents of this description and do not restrict the scope of the invention in any manner whatsoever.

FIGS. 1 and 2 are perspective views of a sample electrical equipment 1 based on the invention.

FIGS. 3 and 4 respectively are views of a first housing and a second housing of electrical equipment where the covers have been removed.

FIGS. 6 and 7 are other views of the first housing of electrical equipment where some of the components have been removed.

Figure 1:
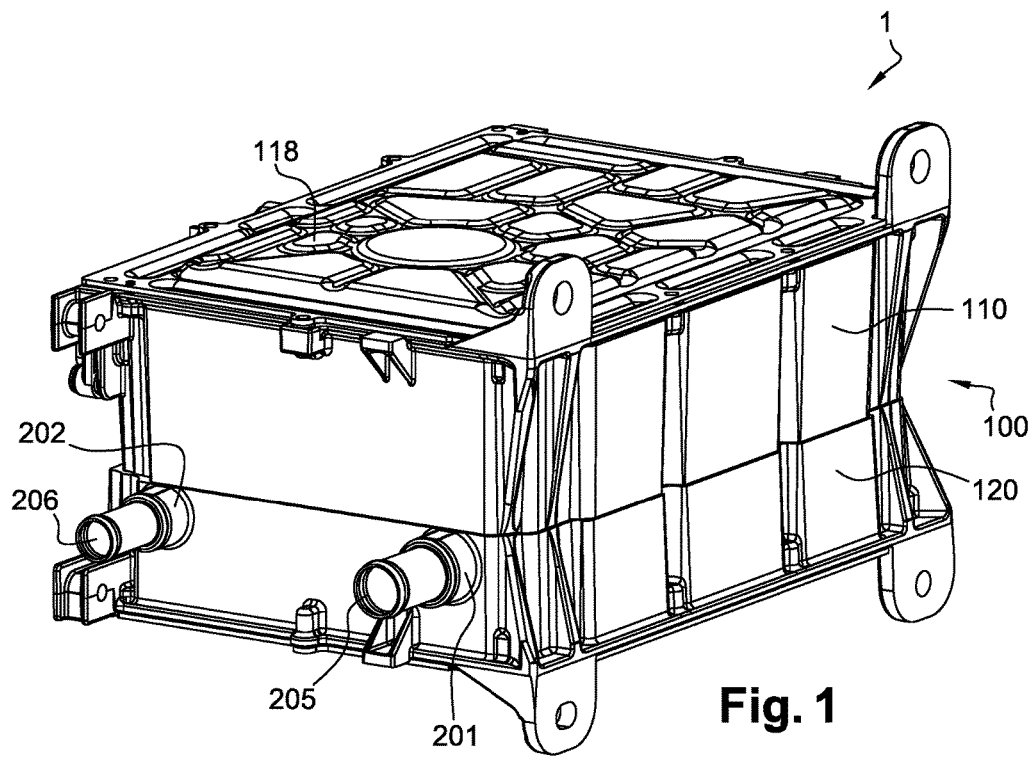
Figure 2:
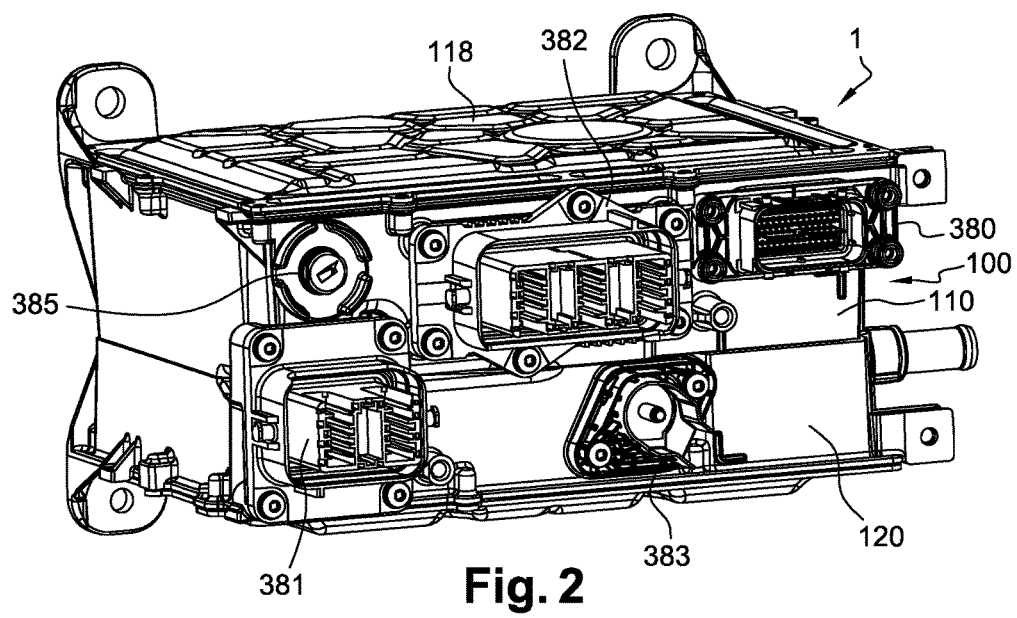
Figure 3:
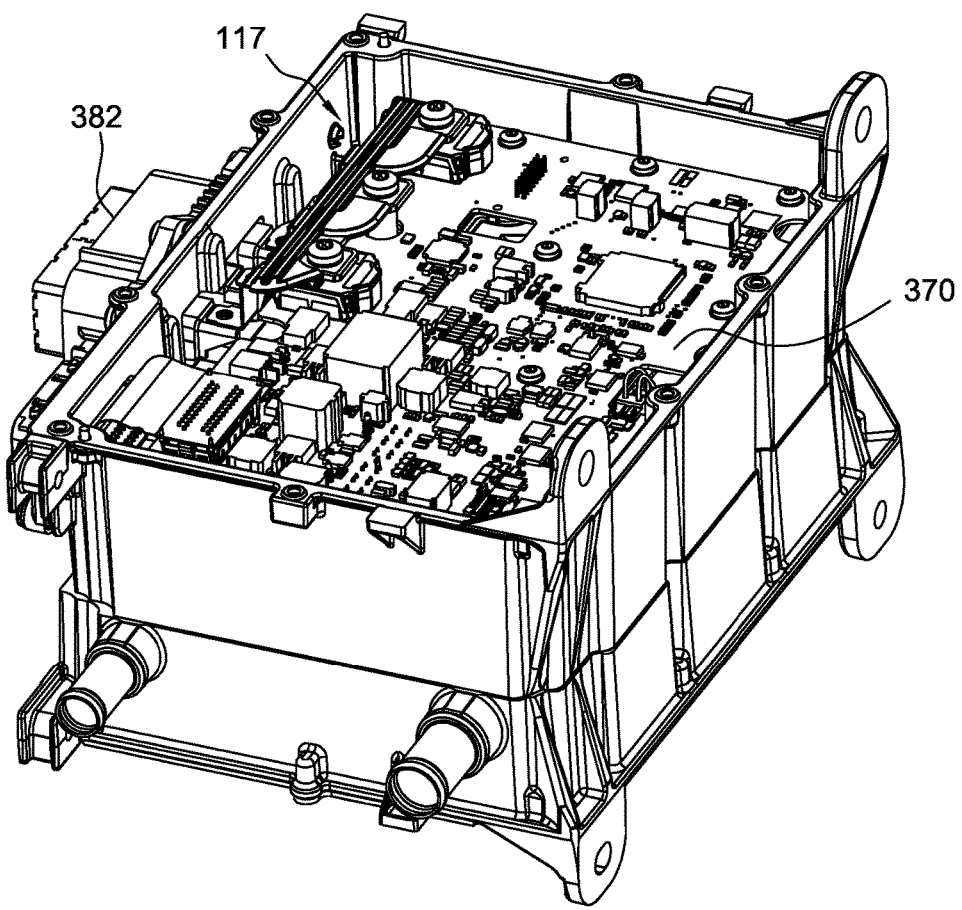

FIGS. 1 and 2 are perspective views of a sample electrical equipment 1 based on the invention. The electrical equipment 1 comprises an assembly 100 housing components of the electrical equipment. The electrical equipment 1 comprises an inverter that supplies power to an electrical machine, such as a rotating electrical machine like a machine designed to drive the wheels of a motor vehicle. The electrical equipment 1 comprises a DC/DC converter that converts voltage between a first direct current circuit and a second direct current circuit in the vehicle.

The electrical equipment 1 assembly 100 comprises a first casing 110 and a second casing 120. The first casing 110 receives one or more first components of the electrical equipment 1 as illustrated on FIGS. 3 and 5 to 7. The second casing 120 receives one or more of the second electrical components as illustrated on FIGS. 4 and 5.

Examples of the first casing 110 and the second casing 120 are illustrated on FIGS. 8 to 19. The first casing 110 comprises a first wall 111 that presses against a second wall 121 of the second casing 120 to form the assembly 100 forming a casing for electrical equipment 1. The first wall 111 and the second wall 121 are referred to hereinafter as the first interface wall 111 and second interface wall 121 respectively. More specifically, the outer edges of the first interface wall 111 and the second interface wall 121 face each other when the first casing 110 is mounted on the second casing 120.

Each casing 110, 120 comprises side walls 116, 126 respectively, extending from the first interface wall 111 and the second interface wall 121 respectively. To be more specific, the side walls 116, 126 extend crosswise from the outer edges of the first 111 or the second 121 interface wall, thereby forming a first housing 117 and a second housing 127 respectively. When the first 110 and second 120 casings are mounted one above the other, the side walls 116 of the first casing 110 and the side walls 126 of the second casing 120 extend in the opposite direction relative to the first casing 110. Each housing 117, 127 may be closed with a cover 118, 128 respectively mounted on the distal ends of the side walls 116, 126. As a result, the first interface wall 111 forms a bottom for the first casing 110, while the second interface wall 121 equally forms a bottom for the second casing 120. The first interface wall 111 and the second interface wall 121 form an interface between the first housing 117 and the second housing 127. More specifically, the first side wall 116 of the first casing 110 form outer walls for the first casing 110, while the second side walls 126 of the second casing 120 equally form outer walls for the second casing 120.

In each casing 110, 120, the side walls 116, 126, and the interface walls 111, 121 form a single block.

One of the second side walls 126, known as the second connection wall 126c, has an opening 20 known as the connection opening, which receives an electrical connector 381 (shown on FIG. 2) from the electrical equipment 1. The electrical connector 381 connects a component 320 of the electrical equipment 1 located outside the assembly 100 forming a casing for electrical equipment 1. The second connection wall 126c comprises a portion 22 known as the connection portion surrounding the connection opening 20. More especially, the connection portion 22 directly surrounds the connection opening 20. Where the opening connection 20 receives the electrical connector 381, a sealing part 381a of the electrical connector 381 presses against the connection portion 22 to seal up the electrical connector 381. The sealing part 381a of the electrical connector 381 can be made of non-conductive plastic material. The sealing part 381a also provides insulation and mechanically secures the connector 381 on the connection opening 20 by holding screws to fasten it to the connection portion 22. The connection portion 22 of the second connection wall 126c extends towards the first casing 110 to face a surface 23 of one of the first side walls 116 known as the first connection wall 116c. The surface 23 is mainly an outer side surface of the first casing 110. As a result, the connection portion 22 of the second connection wall 126c helps to close part of the first connection wall 116c. The connection portion 22 of the second connection wall 126c therefore extends beyond the second bearing surface 123 towards the first casing 110.

The heights of the first and second side walls 116, 126, together with the first interface wall 111 and the second interface wall 121, determine the cubic capacities available in the first housing 117 and second housing 127 to accommodate the first and second components. In previous standard casings, the first 116 and second 126 side walls may have a higher height than needed to house the components. More especially, the sealing part of a connector must be mounted on an appropriate surface to obtain a tight seal. This leaves a smaller space for the connection portion and hence a smaller dimension of the wall carrying the connection portion, if one considers the related area of the connection portion on the casing and the size of the connection opening. In the assembly 100 forming a casing for electrical equipment 1, by allowing the connection portion 22 of the second casing 120 to overlap on the first casing 110, a stress is removed from the height of the side walls 126 of the second casing 120. As a result, the height of the side walls 126 of the second casing may be reduced strictly to the height needed to house the second components. Additionally, it is preferable for the connection portion 22 to be a single block to avoid sealing problems.

Figure 8:
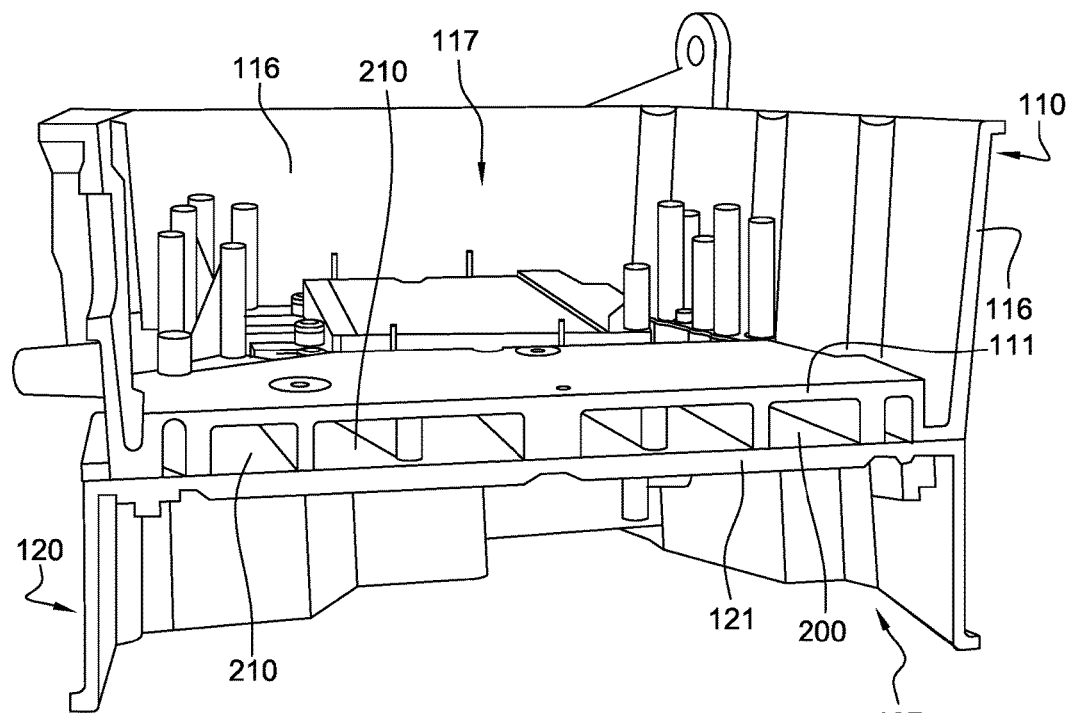
FIGS. 8 and 9 are sectional views of the assembly forming a casing for electrical equipment.
Figure 9:
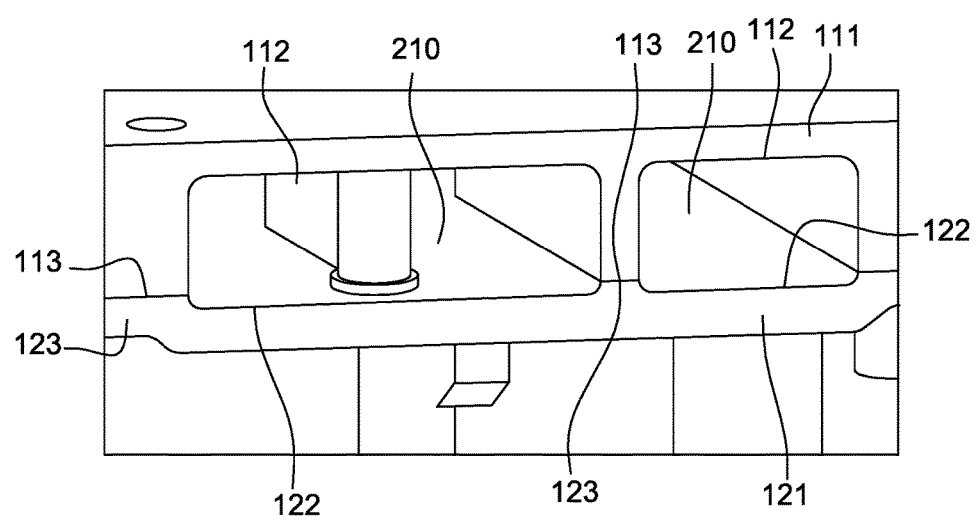
Figure 10:
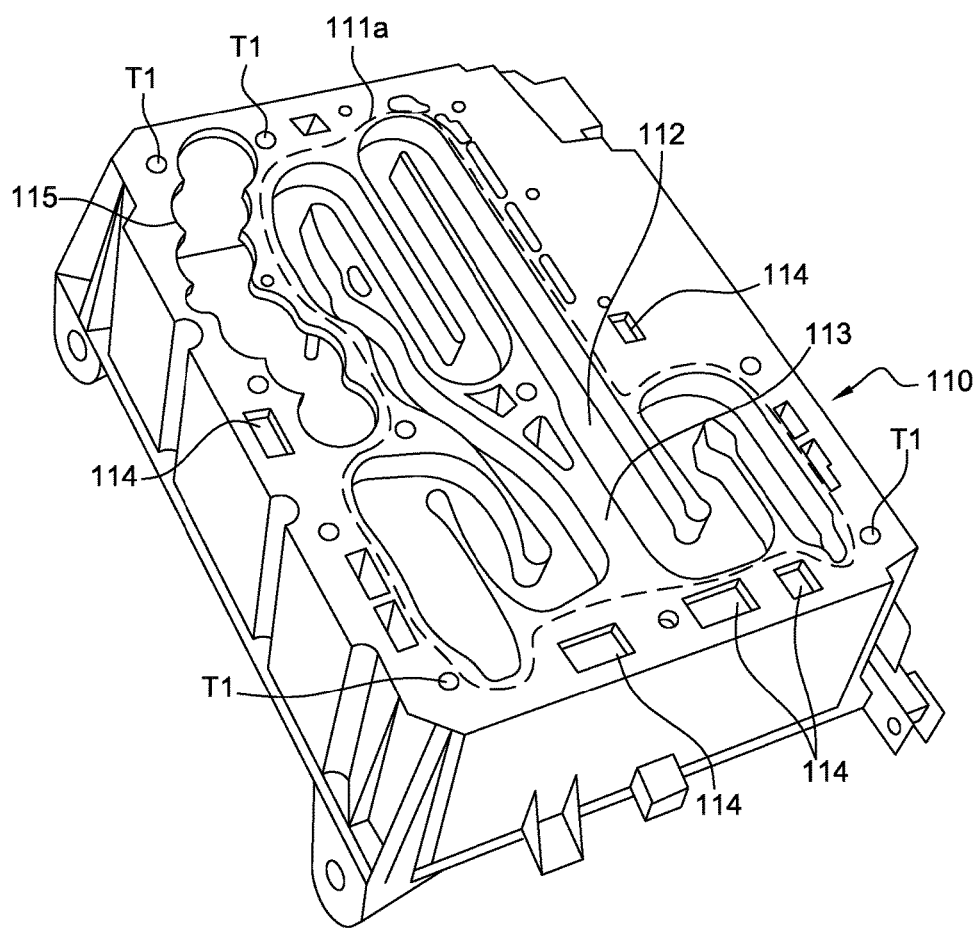
FIGS. 10 and 11 are perspective views of the first casing of the assembly.
Figure 11:
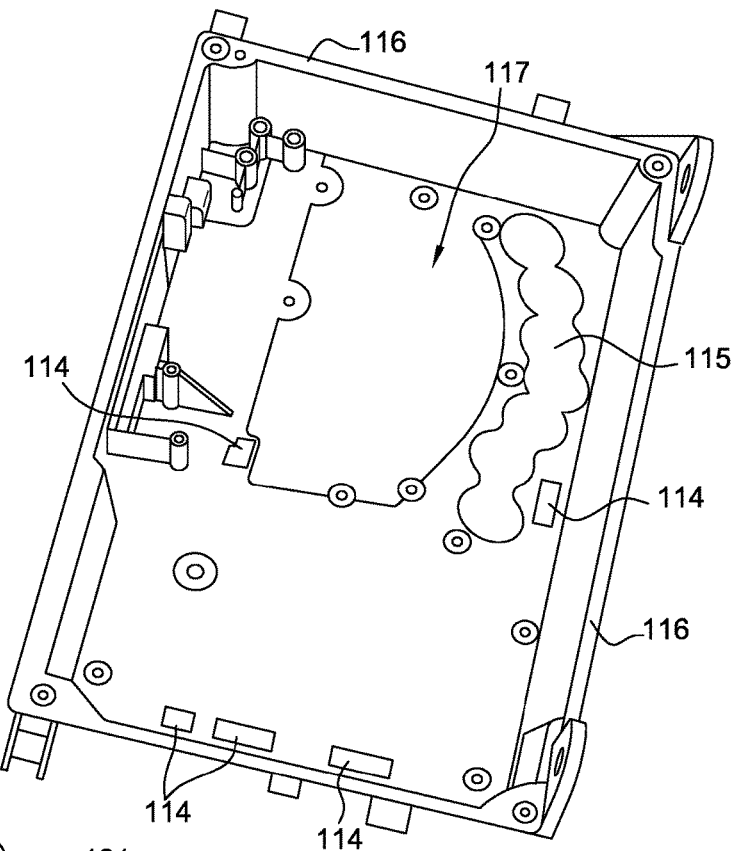
Figure 12:
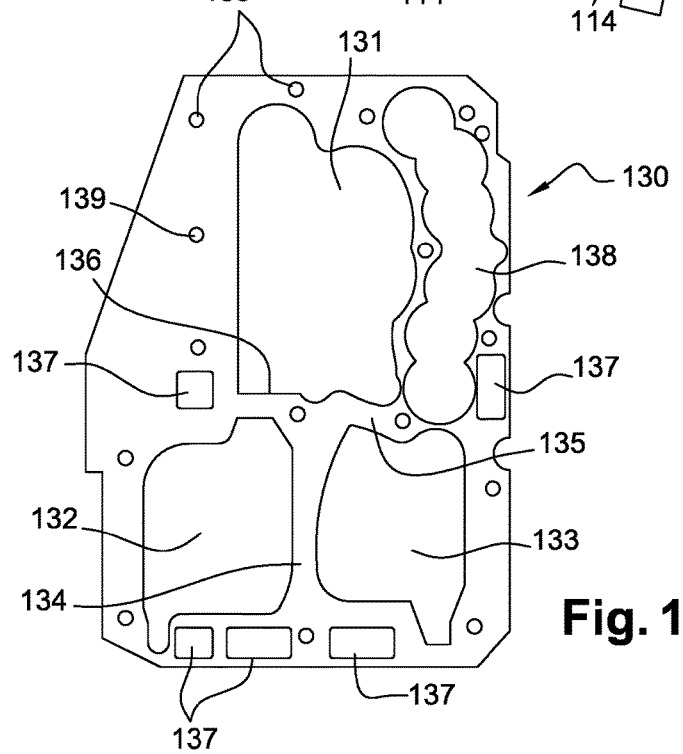
FIG. 12 illustrates a sealing joint inserted between the first and second casings of the assembly.
Figure 13:
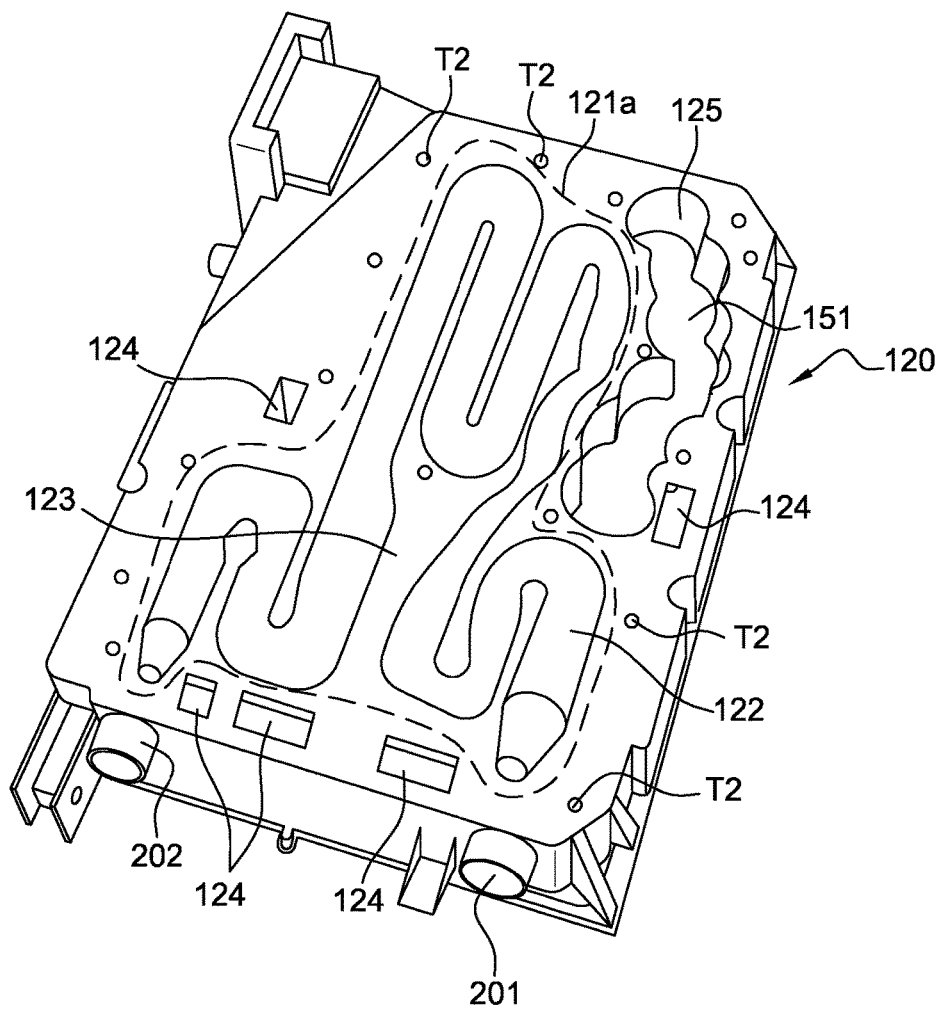
FIGS. 13 and 14 are perspective views of the second casing of the assembly.
Figure 14:
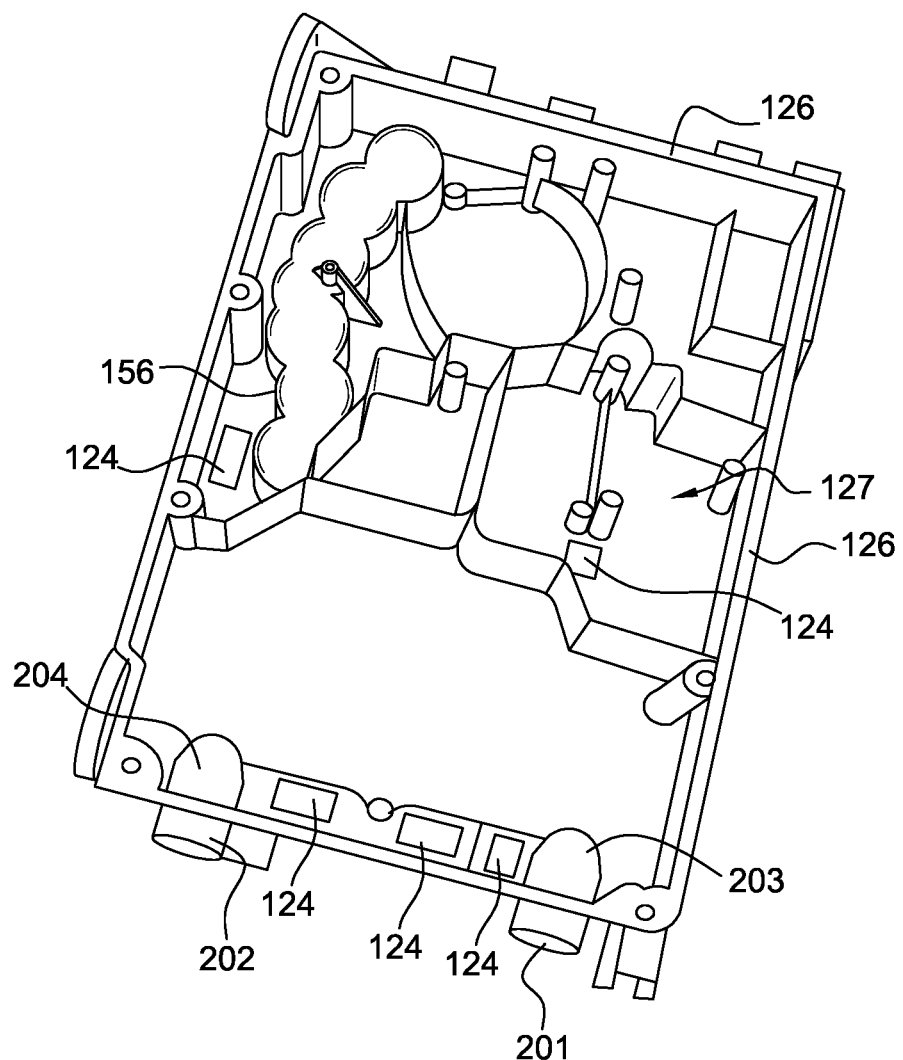
Figure 15:
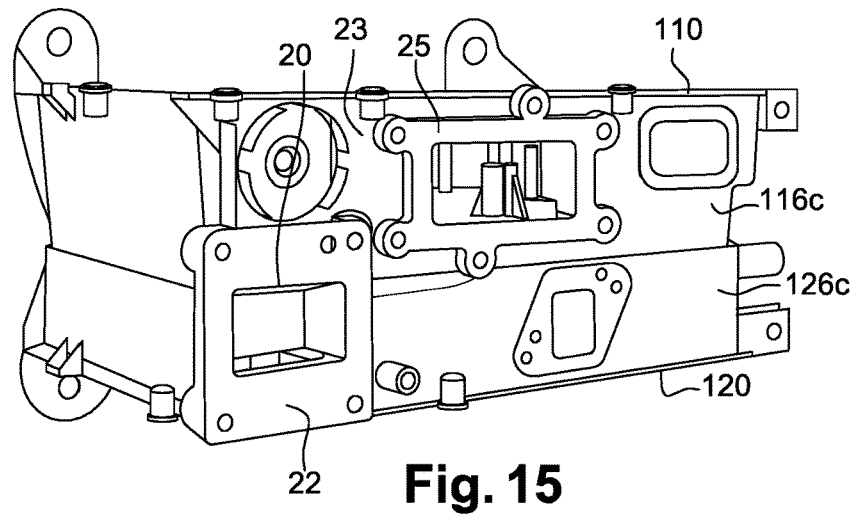
FIG. 15 is a perspective view of the assembly forming a casing.
Figure 16:
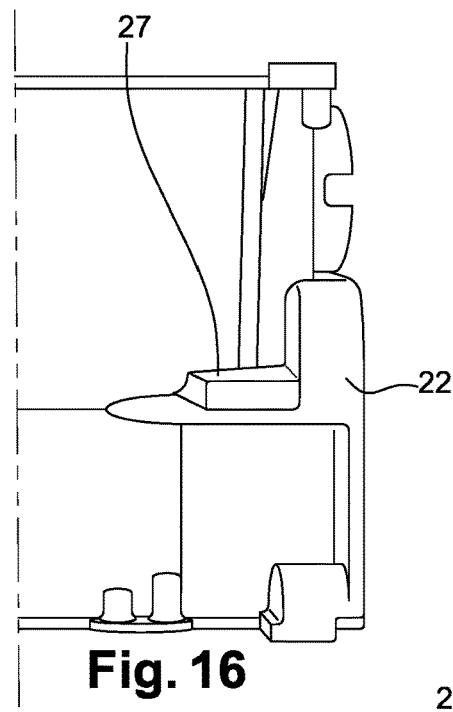
FIGS. 16 to 19 are detail views of the assembly forming a casing.
Figure 17:
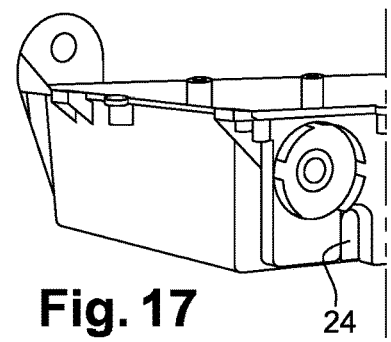
Figure 18:
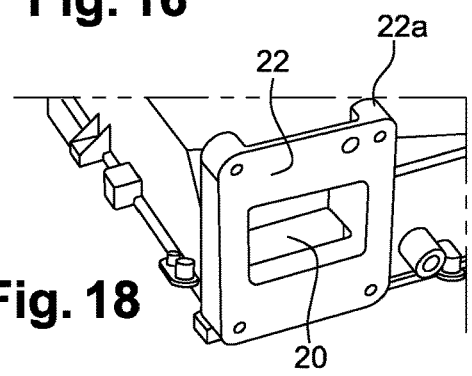
Figure 19:
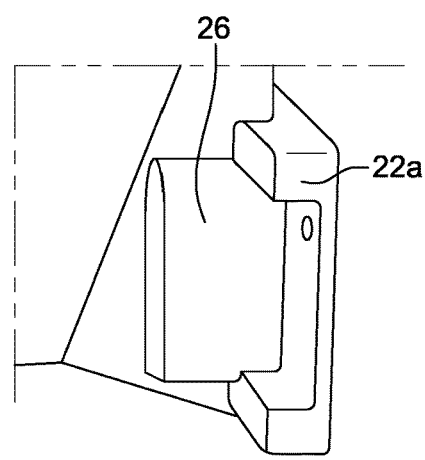

More specifically, the first interface wall 111 and the second interface wall 121 are pressed against one another at the level of their respective surfaces known as the first 113 and second 123 bearing surfaces (illustrated on FIGS. 8, 9). The first interface wall 111 equally comprises a first surface 153 known as the first interface surface, arranged opposite the first bearing surface 113 and located in the first housing 117. The second interface wall 121 comprises a second surface 154 known as the second interface surface arranged opposite the second bearing surface 123 and located in the second housing 127. The first side walls 116 extend from the first interface surface 153 of the first interface wall 111, while the second side walls 126 extend from the second interface surface 154 of the second interface wall 121.

The connection portion 22 of the second connection wall 126c is mounted against the face surface 23 of the first connection portion 116c such that the face of the connection portion 22 is flush with the face of a connection portion 25 located in the first connection wall 116c. This will minimize any misalignments in the assembly 100 and facilitate its integration.

More especially, the connection portion 22 of the second connection wall 126c fits into a corresponding projection 24 in the first casing 110. Actually, the projection 24 is located in the surface 23 of the first connection wall 116c. The projection 24 arranged in the first casing 110 minimizes the loss of space in the first housing 117 and does not affect the integration density of the components in the first housing 117.

Specifically, only part 22a of the connection portion 22 fits into the projection 24. The thickness of Part 22a matches with the depth of the projection 24. Actually, part 22a is thicker than the rest of the connection portion 22 so that it can receive a device to fasten the sealing part 381a of the electrical connector 381. Part 22a may therefore have a hole to hold a screw for instance. By allowing a greater thickness on part 22a receiving the fastening device, there is enough material to accommodate the fastening device that couples the sealing part of the electrical connector 380 to the connection portion 22. The thickness of the connection portion 22 is lower elsewhere to allow for cooling after a "melting/casting" of the second casing 120.

Actually, the second interface wall 120 comprises a protrusion 26 that engages with an edge of the connection opening 20 to create a passage for the electrical connection between the electrical connector 381 and a component of the electrical equipment 1. Specifically, the protrusion 26 extends from the second bearing surface 123 to form a wall with one end touching the edges of the connection opening 20. The protrusion 26 thus creates a passage for the electrical conductor of the electrical connector 381a. A projection 27 is arranged in the first interface wall 111 for receiving the protrusion 26 of the second interface wall 121. Thanks to the protrusion 26, the opening connection 20 of the second connection wall 126c can be shifted towards the first casing 110, thereby further minimizing the stress on the height of the second connection side wall 126c.

The electrical equipment 1 may be equipped with a cooling system 200 formed by the first interface wall 111 and the second interface wall 121 when the first interface wall 111 is set on the second interface wall 121. The cooling system 200 receives a liquid to cool down the electrical equipment 1. The first interface wall 111 comprises a groove 112 that faces another groove 122 of the second wall 120 to form the cooling system 200.

Actually, the first groove 112 and the second groove 122 are arranged face-to-face to form a channel 210 for the cooling system through which the cooling liquid will flow. As a result, the diameter of the cooling channel is divided between the two walls. The two walls share the stress on the wall thickness arising from the formation of the cooling system 200 and balance between themselves the first housing 117 and the second housing 127.

The first interface wall 111 and the second interface wall 121 are arranged to press each other at the level of the bearing surfaces 113, 123. The bearing surfaces 113, 123 are substantially flat at the areas 111a, 121b of the interface walls 111, 121 that form the cooling system 200. The bearing surface 113 of the first interface wall 111 comprises the edges of the first groove 112, while the bearing surface 123 of the second interface wall 121 comprises the edges of the second groove 122. The edges of the first 112 or second 122 groove are the borders between the groove 112, 122, and the surface from which the grooves 112, 122 run deep. The surface from which the first groove 112 runs deep is actually the bearing surface 113 of the first interface wall 111, while the surface from which the second groove 122 runs deep is actually the bearing surface 123 of the second interface wall 121. Specifically, the edges of the first 112 or second 122 grooves are part and parcel of their respective bearing surfaces 113, 123.

The first interface wall 111 may have at least through-hole 114 and the second interface wall 121 may also have at least a through-hole 124 with both edges joined one above the other to create a passage between the first housing 117 formed by the first casing 110 and the second housing 127 formed by the second casing 120. Actually, both through-holes 114, 124 form a passage between the first interface surface 153 and the second interface surface 154. The through-holes 114, 124 are formed outside the areas 111a, 121a of the first 111 and second 121 walls that form the cooling system 200.

A sealing joint may be inserted between the first interface wall 111 and the second interface wall 121. A sample sealing joint 130 is illustrated on FIG. 12. The sealing joint 130 provides a tight sealing around areas 111a, 121a of the first 111 and second 121 interface walls that form the cooling system 200. In this regard, the sealing joint 130 is actually inserted between the bearing surfaces 113, 123 of the first interface walls 111 and the second interface wall 121. The sealing joint 130 may not contain any material on the part located in the cooling system 200 when it is formed, apart from the material bands 134, 135, 136. These material bands 134, 135, 136 enhance the stiffness of the sealing joint 130 so as to ease the handling and mounting of the sealing joint 130. These material bands 134, 135, 136 may have just the right widths to obtain the needed stiffness and they equally form the openings 131, 132, 133. The sealing joint 130 provides a sealing along a closed line surrounding the cooling system 200, particularly around areas 111a, 121a of the walls 111, 121 forming the cooling system 200. The sealing joint 130 can equally provide a sealing around the passages created in the first interface wall 111 and the second interface wall 121. The sealing joints 130 will therefore have holes 137 with edges that provide sealing around the said passages. The sealing joint 130 may also have holes 139 to allow for the passage of the respective devices to fasten the first interface wall 111 to the second interface wall 121.

The cooling system 200 may comprise an input port 201 and an output port 202 through which the cooling liquid enters and comes out from the cooling system 200. The input 201 and output 202 ports are built into the second casing 120, specifically on a side wall 126 of the second casing 120. Actually, the input/output ports 201, 202 are tubular openings in the side wall 116. The input/output ports 201, 202 are extended by tubes 203, 204 that are connected to the second groove 122 of the second interface wall 121 to supply or extract the cooling liquid. Nozzles 205, 206 may be inserted into the input/output ports 201, 202 to adjust them to a cooling liquid supply system.

The first casing 110 may receive one or more first components 300, 310 for instance, as shown on FIG. 7. The first housing 117 may comprise a power electronic module 300 built into the inverter. The power electronic module 300 comprises components for supplying the electrical machine. The first housing 117 may comprise an insulated metal substrate (IMS) electronic card 310 fitted in the DC/DC converter. The IMS card contains components for converting voltage between the first and second power circuits of the motor vehicle.

These power electronic modules 300 and the IMS card 310 may be carried by the first interface wall 111 with their surface touching the first interface wall 111. Actually, the first components 300, 310 are located on one side of the first interface wall 111 opposite the side carrying the first groove 111. Specifically, the power electronic module 300 or the IMS card 310 may be located at least on a surface opposite the first groove 111 for more effective cooling. Components of the power module 300 or the IMS card comprise electronic switches like semiconductor transistors, etc.

The second casing 120 may receive one or more second components 320, 330, 340, 350 accommodated in the second housing 127, as illustrated in FIG. 4. The second housing 127 may comprise an electromagnetic compatibility (or EMC) filter 320 to filter an input signal on the electrical equipment 1, and/or an EMC filter 330 to filter an output signal on the electrical equipment 1, and/or a magnetic component 340 equipped with an inductance to rectify a current supplied to the power module 300, as well as a transformer for the DC/DC converter of the electrical equipment 1 and/or a capacitive module 350 to conduct a zero voltage switching (ZVS) of the electrical switches built into the electronic module 300 and/or on the IMS card 310. The second components 320, 330, 340, 350 may be carried by the second interface wall 121 with one of their surfaces touching the second interface wall 121. Actually, the second components 320, 330, 340, 350 are located on one side of the second interface wall 121 opposite the side carrying the second groove 121. To the greatest extent possible, the second components 320, 330, 340, 350 may be located at least partly on the side opposite the second groove 121 for more effective cooling.

Figure 5:
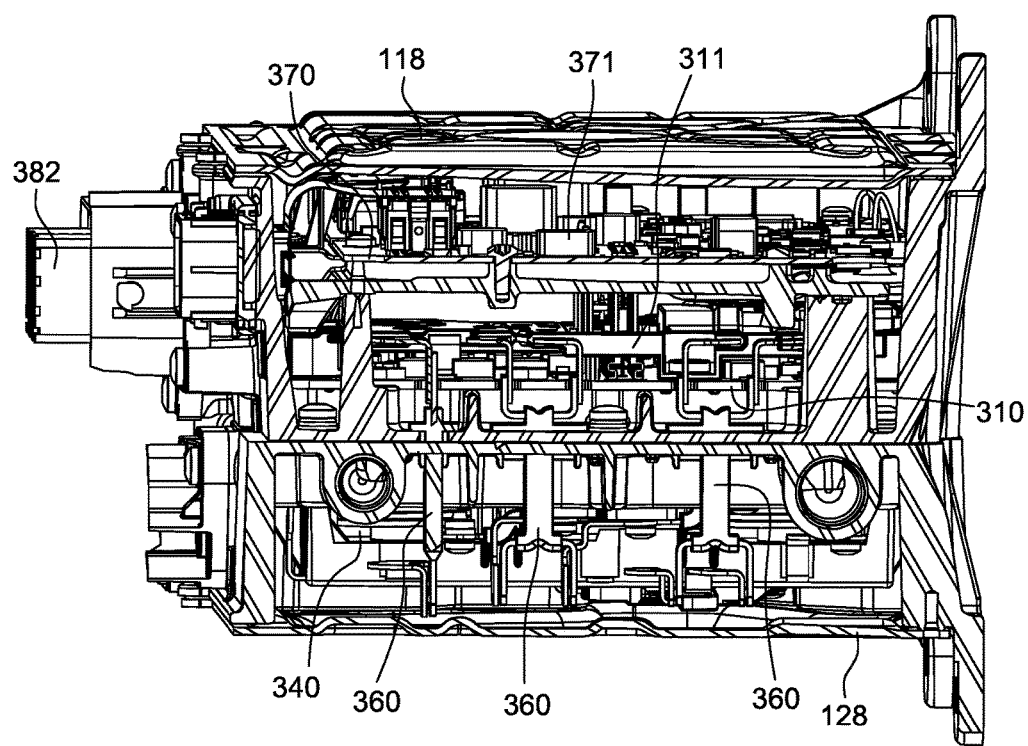
FIG. 5 is a sectional view of the electrical equipment.
Figure 6:
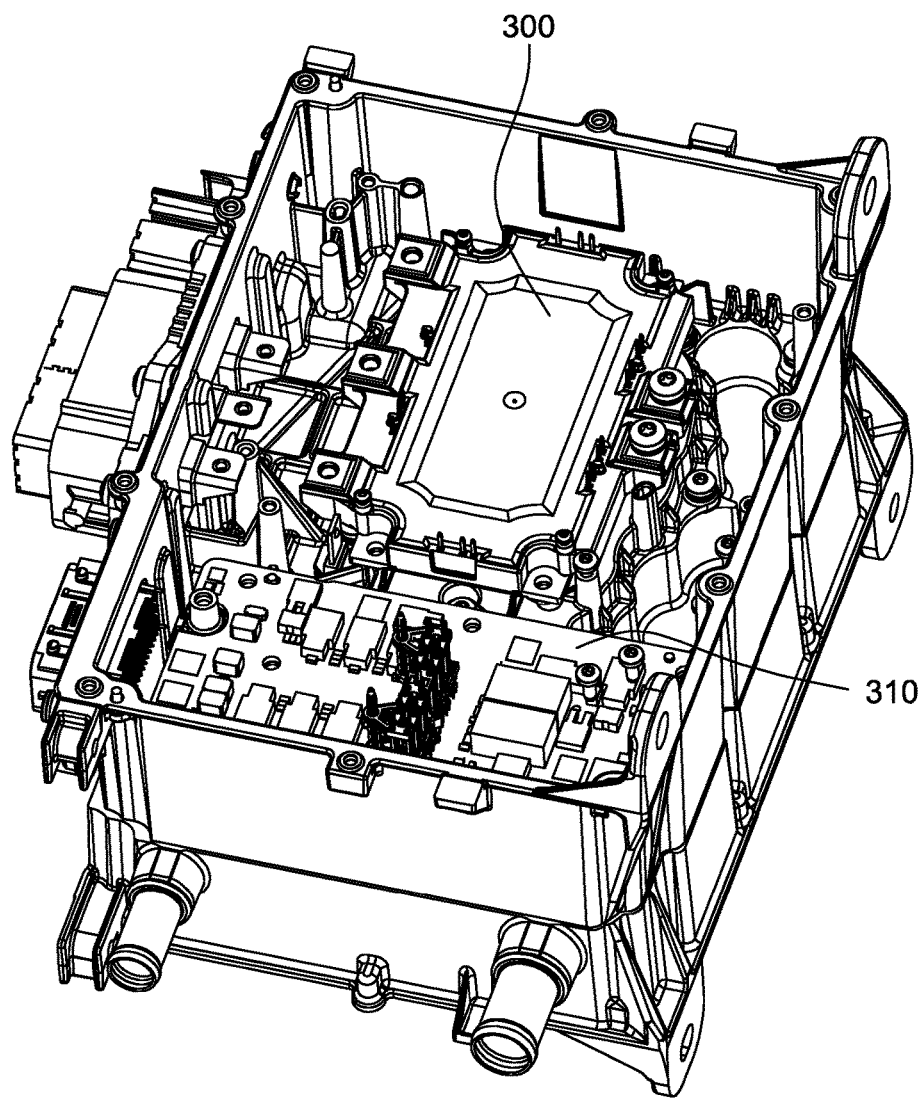

The first components 300, 310 may be connected electrically to the second components 320, 330, 340, 350, particularly through the passages formed by the through-holes 114, 124 formed in the first 111 and second 121 interface walls. FIG. 5 illustrates a sample electrical connection between an electrical connector 311 of the IMS card 310 and a terminal of the magnetic component 340 through an electrical connector 360.

Figures 20, 21:
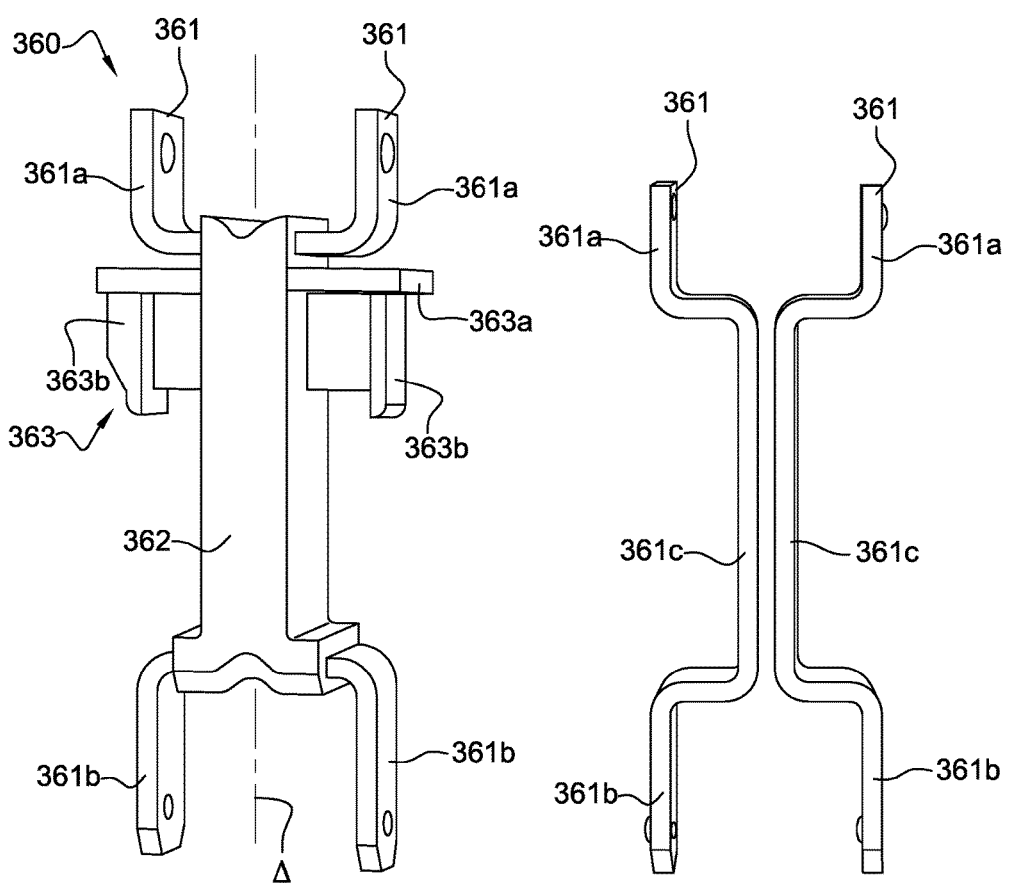
FIG. 20 is a perspective view of an electrical connector used in the electrical equipment.
FIG. 21 is a perspective view of the connector on FIG. 20 without its coating.

The electrical connection 360 is illustrated in more detail on FIGS. 20, 21. It comprises two electrically conductive rigid parts 361. The rigid parts 361 are covered with an electrically insulated coating 362, specifically plastic material applied by overmoulding. Each rigid part 361 comprises a first end 361a connected to a terminal of the first component, particularly to a terminal of an electrical connector 311 of the IMS card 310, and a second end 361b connected to a terminal of the second component, specifically to a terminal of the magnetic component 340. The electrical connections are made by welding or soldering. The ends 361a, 361b are connected together by an intermediate part 361c. Each end 361a, 361b can be connected to the intermediate part 361c by an elbow such that the intermediate parts 361c of both parts 361 are separated by a distance less than the one between the first ends 361a and the one between the second ends 361b. By so doing, there is less insulating material on the intermediate part 361c, thereby enhancing the handling of the connector 360 and minimizing its cost. However, the coating 362 may comprise a guiding device 363 located on the intermediate part 362 before the elbow separating the first end 361a from the intermediate part 362. The guiding device 363 comprises a bar 363a that extends crosswise relative to a main direction A of the electrical connector 360. The main direction A of the electrical connector 360 is actually the direction in which the intermediate parts 361c extend. Where the electrical connector 360 is mounted in the connection passages formed by the interface walls 111, 121, the main direction A extends from the first housing 117 towards the second housing 127. On each end, the crossbar 363a has a protrusion 363b extending in the main direction A towards the second end 361b. The guiding device 363 helps to position the electrical connector 360 in the passage created by the through-holes 114, 124 of the first interface wall 111 and the second interface wall 121.

The electrical connector 360 may comprise a single electrically conductive piece 361, such as in the case where the connector 360 provides an electrical connection between a single first component and a single second component. The electrically conductive piece 361 may thus be a straight blade.

According to an implementation of the invention, the electronic switches of the inverter and the DC/DC converter of the electrical equipment 1 are housed in one of the two casings 110, 120, while the filtering and rectification components 320, 330, 340, 350 of the electrical equipment 1 are housed in the other casing. The filtering components are thus shared between the inverter and the DC/DC converter. Furthermore, by housing the switches in the same casing, it is easier to control them from a single control unit 370. The control unit 370 may be housed in the same casing as the switches as shown on FIG. 5. The control unit 370 may be an electronic card containing components 371 for controlling the switches of the power electronic module 300 and the IMS card 310. Specifically, the electronic switches of the inverter and the DC/DC converter of the electrical equipment 1 are housed in the first casing 110, while the filtering and rectification components 320, 330, 340, 350 of the electrical equipment 1 are housed in the second casing 120.

The first casing 110 and the second casing 120 are bound together by fastening devices that hold the first interface wall 111 onto the second interface wall 121. The fastening devices may be screws that fit into corresponding holes T1 and T2 on the first interface wall 111 and the second interface wall 121. The fastening devices may also be clips held by the side walls 116, 126 of the first casing 110 and the second casing 120.

The electrical equipment 1 may comprise a signal connector 380 to exchange data signals between the electrical equipment components and parties outside the electrical equipment, such as an operator/driver of the vehicle. The electrical equipment 1 may comprise a power input connector 381 that supplies power to the components of the electrical equipment 1. Actually, the power input connector 381 provides electrical connection to a first power circuit of the motor vehicle, namely an electrical storage unit of the first power circuit of the vehicle, to supply power to the input of the inverter and/or DC/DC converter of the electrical equipment 1. A power output connector 382 may transfer power between the inverter of the electrical equipment 1 and the phases of the electrical machine controlled by the inverter. A DC/DC output electrical connector 383 may be used to transfer power between the DC/DC converter of the electrical equipment 1 and a second power circuit of the vehicle, namely with an electrical storage unit of the second power circuit. The first power circuit may be a high voltage circuit, while the second power circuit may be a low voltage circuit. These electrical connectors 380, 381, 382, 383 are all located on one side of the assembly forming a casing for the electrical equipment 1 illustrated on FIG. 2. Actually, these electrical connectors 380, 381, 382, 383 are mounted on the side walls 116, 126 of the first casing 110 and second casing 120, both located on the same side of the assembly 100. Actually, the power input connector 381 is positioned on the connection portion 22 of the second connection wall 126c. The power output connector 382 is positioned on the connection portion 25 of the first connection wall 116c. Specifically, the power input connector 381 is electrically connected to the EMC filter 320, which filters an input signal on the electrical equipment 1.

The electrical equipment 1 may have a vent 385 to control moisture inside the electrical equipment 1. The vent 385 will be placed on one side of the assembly 100 forming a casing for the electrical equipment 1. For instance, it may be placed on a side wall 116 of the first casing 110. It may also be placed on a side wall 126 of the second casing 120.

The first interface wall 111 may comprise a through-hole 115 with edges that are connected to an opening 125 of the second wall 120. A protrusion 156 extends from the edges of the opening 125 coming from the second interface surface 154. The protrusion 156 creates a cavity 151 to accommodate a capacitive block 315 as illustrated on FIG. 7. The capacitive block 315 contains several condensers 316. It is connected to the inverter, specifically to the power electronic module 300 and the DC/DC converter, specifically to the IMS card 310. Actually, the capacitive block 315 is located in an electrical connection between the first power circuit of the vehicle and the power electronic module 300 and the IMS 310 card. It serves as a power reserve located directly next to the power electronic module 300 and the IMS card 310, used especially for partitioning relative to their switches. In this regard, the capacitive block 315 is connected to the power module 300 and the IMS card by an electrical connecting bar (not illustrated). The through-hole 115 of the first interface wall 111 is located outside the area 111a of the first interface wall 111 designed to form the cooling system 200. The opening 125 of the second interface wall 121 is located outside the area 121a of the second interface wall 121 designed to form the cooling system 200. The sealing joint has a hole 138 for the passage of the capacitive block 315.

The invention is not restricted solely to the example described hereinabove. The figures simply illustrate a specific example of how it can be implemented in combination with several other methods of implementation. However, the specifications relative to the methods of implementation may be independent of each other from one method to another or implemented in combination with one another as concluded in the claims.

The invention claimed is:

1. An assembly forming a casing for electrical equipment, the said assembly comprising:
a first casing for receiving at least a first electronic component of the electrical equipment;
a second casing for receiving at least a second electronic component of the electrical equipment;
a first wall known as the first interface wall of the first casing and a second wall known as the first interface wall of the second casing, the said walls arranged to press against one another to form the assembly;
wherein:
the first and the second casings each comprise at least a side wall respectively known as the first and second side walls, which extend respectively from the first interface wall and the second interface wall in an opposite direction relative to the other casing; and
the second side wall has an opening known as the connection opening for receiving an electrical connector and a portion surrounding the opening known as the connection portion for receiving a sealing part of the electrical connector, with the said first and second side walls arranged such that the connection portion extends towards the first casing so as to face one surface of the first side wall.

2. The assembly according to claim 1 whereby the first and second side walls each form an outer wall of their respective casings, with the connection opening arranged for receiving an electrical connector to connect a component of the electrical equipment) from outside the assembly forming the casing.

3. The assembly according to claim 1 whereby at least a part of the connection portion of the second side wall fits into a corresponding projection located on the surface of the first side wall.

4. The assembly for electrical equipment according to claim 3 whereby the said part of the connection portion has a thickness designed to match with the depth of the projection and has a hole to receive the device to fasten the sealing part of the electrical connection to the connection portion.

5. The assembly for electrical equipment according to claim 1 whereby:
the first interface wall comprises a protrusion, the said protrusion engaging with the edge of the connection opening to create a passage for an electrical connection between the electrical connector and a component of the electrical equipment;
the first interface wall comprises a projection arranged for receiving the protrusion from the first interface wall.

6. An electrical equipment comprising:
an assembly according to claim 1;
at least a first electrical component housed in the first casing;
at least a second electrical component housed in the second casing;
a first electrical connector passing through the connection opening and connected electrically to an electrical component of the electrical equipment, a sealing part of the first electrical connector fitted on the connection portion.

7. The electrical equipment according to claim 6, comprising:
switches of an inverter and/or switches of a DC/DC voltage converter housed in the first casing; and
filtering and rectification components housed in the second casing.

8. The electrical equipment according to claim 6 whereby the first electrical connector is designed to exchange power between the components of the electrical equipment and a component outside the electrical equipment.

9. The electrical equipment according to claim 6 whereby the first and second walls respectively have at least a through-hole with edges that fit into each other to create a passage for an electrical connection between the first and the second electrical components.

10. The electrical equipment according to claim 9 whereby the electrical connection between the first and the second components is provided by a second electrical connector comprising:
- an electrically-conductive rigid part covered with an electrically-insulated material coating;
- a first end electrically connected to an electric terminal of the first component; and
- a second end electrically connected to an electric terminal of the second component.

\* \* \* \* \*